United States Patent [19]

Maslar et al.

[11] Patent Number: 5,628,112

[45] Date of Patent: May 13, 1997

[54] CIRCUIT BOARD ASSEMBLY SYSTEM AND METHOD

[75] Inventors: Francis J. Maslar, Newtown; Robert J. Cantando, Drexel Hill; Hugh V. Wilson, Willow Grove; Virender Sandhu, Chalfont, all of Pa.

[73] Assignee: Ford Motor Company, Dearborn, Mich.

[21] Appl. No.: 398,267

[22] Filed: Mar. 3, 1995

[51] Int. Cl.⁶ .................................................. H05K 3/02
[52] U.S. Cl. ..................... 29/846; 29/711; 29/712; 29/829; 414/786
[58] Field of Search .................... 29/829, 711, 712, 29/846; 414/786

[56] References Cited

U.S. PATENT DOCUMENTS

| | | |
|---|---|---|
| 3,600,785 | 8/1971 | Cook et al. ................... 29/712 |
| 5,058,727 | 10/1991 | Jahns et al. . |
| 5,086,910 | 2/1992 | Terpstra . |
| 5,186,308 | 2/1993 | Munro . |
| 5,228,558 | 7/1993 | Hall . |
| 5,318,167 | 6/1994 | Bronson et al. . |

FOREIGN PATENT DOCUMENTS

| | | | |
|---|---|---|---|
| 456218 | 11/1991 | European Pat. Off. ................ 29/829 |
| 572878 | 12/1993 | European Pat. Off. ................ 29/829 |
| 4-240031 | 8/1992 | Japan ................................ 29/829 |
| 6-6089 | 1/1994 | Japan ................................ 29/829 |

*Primary Examiner*—Carl J. Arbes
*Attorney, Agent, or Firm*—Mark L. Mollon; Roger L. May

[57] ABSTRACT

A peer-to-peer control system for a circuit board production line includes multiple processing stations, each of which has an adjustable width conveyor. Control means are provided at each station for controlling the width of the conveyor, receiving board width data signals from an adjacent upstream processing station, and passing the board width data signal, in turn, to an adjacent downstream processing station. A data signal communication network directly connects the controller of each of the processing stations, such as a programmable logic controller, to the controllers of adjacent upstream and downstream stations. Data signals corresponding to the width of circuit boards to be processed by the circuit board production line progress downstream through the line in tandem with circuit boards of that width. The width of conveyors associated with the individual stations can be changed from time to time without emptying the entire production line, and without the need for a master host computer control system keeping track of the width and location of boards in the production line and the width of the conveyors of the various processing stations. Distributed control, relying on the controllers of an upstream station to signal directly to an adjacent downstream station the need for a conveyor width change, provides increased production line flexibility with decreased control system complexity.

14 Claims, 2 Drawing Sheets

CIRCUIT BOARD ASSEMBLY SYSTEM AND METHOD

INTRODUCTION

The present invention is directed to a multi-station production line for assembly or other processing of circuit boards, and to a peer-to-peer control system for such a production line. In particular, the invention is detected to a production line and control system adapted to processing a sequence of circuit boards of varying widths.

BACKGROUND

In multi-station production lines, circuit boards are fed from one station to another, each station performing an operation on the circuit board, for example, applying or reading a bar code sticker on the board, populating the board with circuit elements, soldering the board, inspecting the board, etc. Each of the stations has a conveyor extending longitudinally from a receiving end to a location within the station at which the aforesaid operation is performed, and then to a discharge end. The conveyor forms a slot having a lateral width corresponding to the width of the circuit board. The circuit board is passed from the discharge end of the conveyor of one station to the receiving end of the conveyor of an adjacent downstream station. Thus, each station is downstream of those which previously acted on the circuit board, and is upstream of those which will act on the circuit board subsequently.

Advanced manufacturing techniques call for circuit board assembly lines to be adapted to handle circuit boards of varying widths. Thus, the conveyors of the individual processing stations should have an adjustable lateral width.

Existing automated systems provide a controller, such as a programmable logic controller (PLC), on each processing station to control various functions of the conveyor, including its lateral width. Each PLC is connected via a computer network to a master host computer. The host computer receives circuit board width information, for example, from a bar code reader, scanning circuit boards as they are fed to the production line. Additional bar code readers or other suitable means are required to track the location of each board as it proceeds through the production line. The host computer also tracks the width of each conveyor. When a board is processed which requires the conveyor at a given processing station to change width, the host computer must recognize the need to change width by linking the board with the location tracking information it receives. Upon recognizing a need to change conveyor width at a given processing station, the host computer sends a command to that station to actuate a conveyor width control mechanism. A signal is then passed to the host computer indicating that a width change has been completed. The host computer then sends another signal to the adjacent upstream processing station that the circuit board in question may be passed downstream. This control architecture is disadvantageously complex and computing-intensive. The complexity of the control architecture tends to increase production costs and the frequency and seriousness of control system failures.

Other known circuit board production line control systems having less complex computer control architecture, can only undergo width changes when the production line is completely empty of circuit boards. Thus, typically, only a single circuit board type or model can be processed in any period of time. To change conveyor width, the production line is allowed to empty and all production stations are then changed over simultaneously. This involves considerable production inefficiency, as all upstream processing stations must be idled while circuit boards of a previous model are conveyed through the last downstream processing station. Similarly, after width changeover, downstream processing stations sit idle awaiting the arrival of the new circuit boards.

It is an object of the present invention to provide a computer control system for a circuit board production line which allows automated conveyor width changeover of the individual processing stations of the production line, without the need for the complex control architecture based on a master host computer, and without requiting that the entire production line be emptied of circuit boards to permit conveyor width changes. Additional objects and advantages of the invention will be better understood from the following disclosure of the invention and detailed description of certain preferred embodiments.

SUMMARY

In accordance with one aspect, a peer-to-peer control system is provided for a circuit board production line, wherein multiple circuit board processing stations each has an adjustable width conveyor track and control means, for example, a PLC or the like, for controlling the width of the conveyor track and typically, other functions as well. The control system comprises a data highway, that is, a data signal communication network directly connecting the controller of each of the processing stations to the controller of upstream and downstream adjacent processing stations. The controllers are adapted to receive signals indicating a needed change in the lateral width of the conveyor for that processing station directly from an adjacent upstream processing station via the data highway. It should be understood that the reference here to signals being passed directly between adjacent processing stations means that the signals pass from the controller of one station to that of the adjacent station without passing through a master host computer. The controllers act on the width signal and are adapted to then pass the width change signal to the downstream adjacent station. The width change signal is passed to a downstream station when the adjacent upstream station is ready to pass to it a circuit board of the new width. Thus, a processing station which has received a width change signal changes its conveyor width and passes the width change signal to the adjacent downstream processing station. In this fashion, width change signals are passed downstream along a circuit board production line, in tandem with circuit boards of the corresponding widths. It should be recognized that in a production line having the peer-to-peer control system disclosed here, several different width change signals can be progressing simultaneously downstream along a circuit board production line in tandem with respective circuit boards. Thus, any sequence of circuit boards within the width range of the conveyors may be processed simultaneously in the production line without the need for the complex control architecture mentioned above requiting a master host computer, and without the need to empty the production line for each width changeover.

In accordance with another aspect, a circuit board production line comprises a series of circuit board processing stations. At least some of the processing stations are adapted to perform an operation on the circuit boards, for example, inspecting, soldering, populating or labeling the boards, etc. Conveyor means associated with each of such processing stations includes a board conveyor track having adjustable lateral width to accommodate a range of circuit board widths. A control device, such as a PLC or the like, is provided for each of the processing stations to actuate a mechanism for changing the lateral width of the conveyor track in response to a signal received from an adjacent upstream station, as described above. Thus, upon receiving a board width data signal corresponding to a new width to accommodate a circuit board to be operated on next by that processing station, the controller actuates the conveyor width adjustment mechanism and then passes the board width data signal to the controller of the adjacent downstream processing station. A data signal communication network directly connects the controllers of each of the processing stations to the controllers of adjacent upstream and downstream stations.

Those who are skilled in the art, that is, those who are knowledgeable with respect to the technology of circuit board production lines, will recognize that the circuit board production line disclosed here, and the peer-to-peer control system for such production line, represent a significant technological advance. Through the use of a data highway, width change signals are sent not by a master host computer, but by the controller for an adjacent upstream processing station. Thus, automated changeover of individual processing stations of a circuit board production line is achieved without requiring that the production line be emptied, and without requiring complex control architecture based on a master host computer. These and additional features and advantages will be discussed further below in the context of certain preferred embodiments.

BRIEF DESCRIPTION OF THE DRAWINGS

The selection and ordering of processing stations for a circuit board production line will depend in large measure on the nature and characteristics of the circuit board being assembled or otherwise processed. One or more processing stations may be required, for example, for populating the circuit board with circuit elements, depending in part on the number of circuit elements to be attached to the board. The following detailed discussion makes reference to the appended drawings, which are illustrative of circuit board production lines and control systems embodying general principles of the present invention.

The same reference numbers are used in FIGS. 1 and 2 in referring to the same items or features.

DETAILED DESCRIPTION OF CERTAIN PREFERRED EMBODIMENTS

As mentioned above, the individual operations performed by the circuit board production line which is assembling or otherwise processing a circuit board, are well known to those skilled in the art. Accordingly, in discussing the circuit board production line schematically illustrated in FIG. 1, the particular operations to be performed by any given processing station will not be discussed in any detail. The processing stations are modular in the sense that they typically are added, deleted, or rearranged as to sequence, as required to accomplish the production objectives of the production line.

Figure 1:
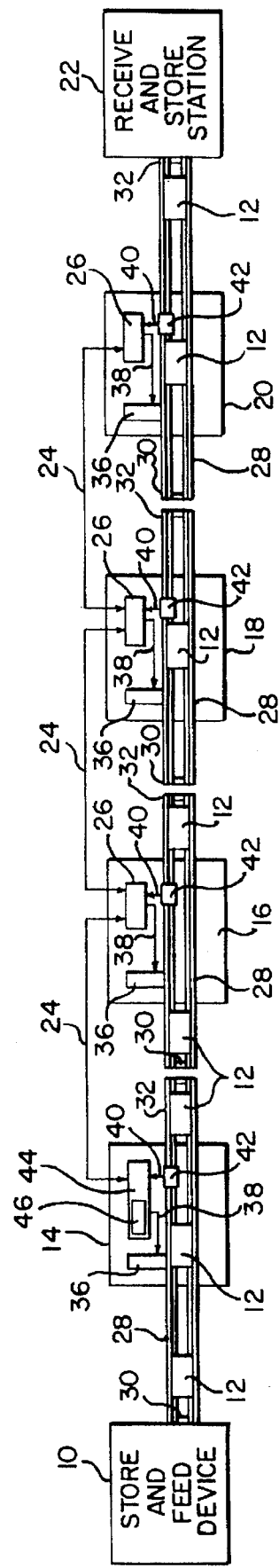
FIG. 1 is a schematic view of a circuit board production line incorporating a peer-to-peer control system in accordance with certain preferred embodiments of the invention.
Figure 2:
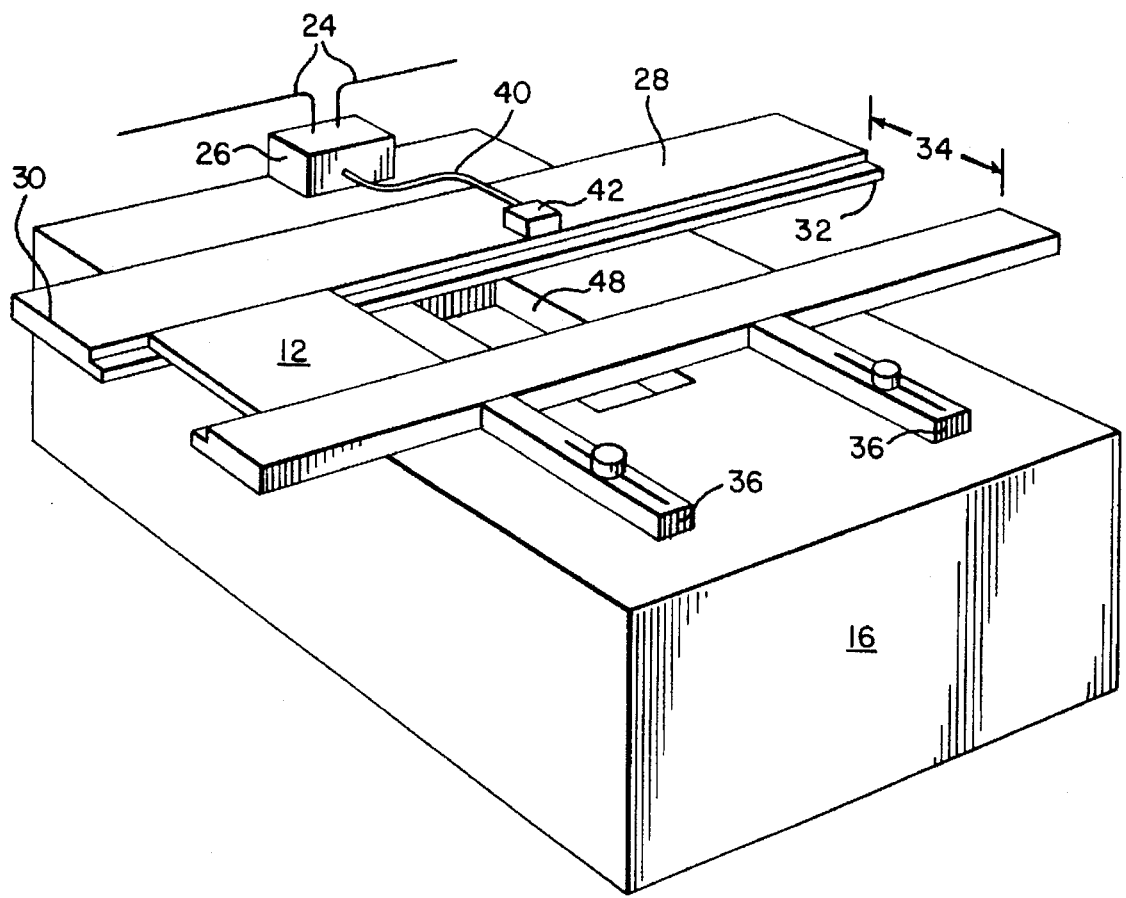
FIG. 2 is a schematic perspective view of a processing station suitable for use in the circuit board production line illustrated in FIG. 1.

The circuit board production line of FIG. 1 is seen to include a destacker 10 for holding and feeding circuit boards (e.g. bare boards to be assembled with circuit elements) at the start or upstream end of the production line. Circuit boards 12, at various states of completion, are shown in various locations along the production line. A first processing station, specifically, a lead station 14 follows the destacker 10. That is, the lead station 14 is downstream adjacent to destacker 10. Processing station 16 is downstream adjacent to lead station 14. Similarly, processing station 18 is downstream adjacent to station 16, and final processing station 20 is downstream adjacent to station 18. The final station in the processing line of FIG. 1, unload station 22, is downstream of station 20. Unload station 22 receives processed circuit boards after they are processed and discharged by station 20. In the embodiment of FIG. 2, processing station 16 is seen to have an operating zone 48 between the receiving end 30 and the discharge end 32 of conveyor 28.

The production line of FIG. 1 further comprises a data highway 24 which provides communication means for data signals between controllers of the various stations. Each of stations 16, 18 and 20 has a programmable logic controller 26, for example, a model SLC 502 controller, available from Allen Bradley, which is suitable for use with an Allen Bradley Data Highway 485. Other suitable controllers include the Allen Bradley PLC 5/10 for the board destacker, for example. Allen Bradley SLC 502 controllers are an alternative to the PLC 5/10. They communicate, for example, via a data highway such as the Allan Bradley Data Highway 485.

Suitable alternative controllers and communication systems are commercially available, and will be apparent to those skilled in the art for use in the present invention in view of the present disclosure. Controller 26 is seen in each case to be connected via the data highway 24 directly to the controller of adjacent upstream and downstream processing stations.

Each of processing stations 16, 18 and 20 is seen to further comprise a conveyor 28 extending longitudinally in the direction of travel of the circuit boards. Longitudinal direction will be recognized to be the direction of travel of the circuit boards in the conveyor. The lateral width of the circuit board is in the plane of the circuit board as carded by the conveyor, perpendicular to the longitudinal direction. At each station the conveyor extends from a board receiving end 30 to a board discharge end 32. The board discharge end of one conveyor is seen to be immediately adjacent to the board receiving end of the adjacent downstream processing station. A larger than usual gap is shown between the conveyor tracks of adjacent stations. Typically, the conveyor tracks abut and may even be releasably locked together. In the case of station 20, the board discharge end 32 is adjacent receiving station 22, which would comprise a suitable mechanism for receiving the board and, typically, stacking it for shipment, further processing, etc. Although the conveyors 28 are shown schematically as extending without interruption from their receiving end to their discharge end, those skilled in the art will recognize that certain processing stations may incorporate board handling mechanisms which handle the boards at some intermediate point during the processing at that station.

The conveyors 28 are adjustable as to their lateral width 34. Their lateral width is controlled by conveyor width adjustment means 36. Suitable designs and apparatus for conveyor width adjustment mechanisms are commercially available and well known to those skilled in the art. The programmable logic controllers 26 at each station control the width adjustment mechanism 36, preferably by signal connection 38. In accordance with one preferred embodiment, an encoder can be mounted onto a lead screw of a screw-type width adjustment mechanism. As mentioned above, the width of a conveyor at an individual processing station is changed when that conveyor is empty of boards. Controller 26 at each station also controls the conveyance of boards by conveyor 28, and is connected via signal linkage 40 to sensor 42 adapted to detect the presence or absence of boards in the conveyor.

The controller 44 of lead station 14 operates and has features substantially like controllers 26 discussed above. Lead station controller 44 further comprises data input means for receiving board width information and generating the aforesaid board width dam signal in response to such information input. The data input means of controller 44 may be manually operable. Thus, for example, controller 44 may include thumbwheels or a numeric keypad by which a line operator can input a new width. The information input to controller 44 alternatively may merely identify a new circuit board to be fed to the lead station, from which controller 44 can look up the width of the new board, for example, via a lookup table stored in ROM or other suitable memory of the controller 44. Alternatively, the data input means may comprise an automated data input mechanism, such as a bar code scanner. For example, a bar code scanner associated with destacker 10 could provide information to controller 44, identifying either the new width or the new board, as discussed above. Data input means suitable for use with programmable logic controllers are commercially available and will be readily apparent to those skilled in the art in view of the present disclosure. Preferably, the data input means has associated with it a visual display device 46, for example, a CRT screen, LED device or the like, for displaying information indicative of data input to controller 44. Such visual display means can provide a confirmation that correct data was input to controller 44, and can allow the current status of the lead station conveyor to be easily determined.

In operation, the peer-to-peer control system implements the conveyor width change over strategy indicated above, preferably employing standard SMEMA interfacing or the like between stations via the aforesaid data highway. For communication between stations produced by different manufacturers, a global variable set can be provided at installation of each station to indicate whether or not it is upstream from a processing station of the same or different manufacturer. When a processing station receives a width change message via the data highway from an adjacent upstream station, the following logic would be executed:

processing station controller receives "change width" signal directly from adjacent upstream processing station via the data highway; processing station controller signals the controller of the adjacent upstream processing station that it is "BUSY" to prevent circuit board of new width of being passed to it prior to conveyor width change-over (e.g., by setting SMEMA upstream=BUSY);

processing station controller receives signal from its conveyor sensor that its conveyor is empty;

processing station controller actuates conveyor width change mechanism to change the width of its conveyor to the new circuit board width;

processing station controller sends "change width" signal to the controller of the adjacent downstream processing station directly via the data highway (sending the "change width" signal to the adjacent downstream processing station at this point will cause the adjacent downstream processing station to signal "busy," (e.g. by setting its SMEMA upstream=BUSY);

processing station controller signals the controller for the adjacent upstream processing station that it is ready to receive circuit boards of the new width (e.g., by setting its SMEMA upstream=NOT BUSY);

the controller for the adjacent upstream processing station actuates its conveyor to pass circuit boards of the new width;

the controller for the processing station signals the controller of the adjacent downstream processing station that circuit boards of the new width are available (e.g., by setting SMEMA downstream=BOARD AVAILABLE);

after the adjacent downstream processing station has become empty and then changed its conveyor width, its controller signals via the data highway directly to the controller of the original processing station that the adjacent downstream station is ready to receive circuit boards of the new width (e.g., by the adjacent downstream processing station setting its SMEMA upstream =NOT BUSY); and the controller of the processing station actuates its conveyor to pass circuit boards of the new width to the adjacent downstream station.

This signaling and change-over sequence is repeated in turn at each processing station along the production line for each new circuit board width.

Those skilled in the art will recognize that certain variations are possible, or even necessary, in the signaling sequence, based on commonality of manufacturer amongst the processing stations and other well-known factors. Significantly, however, it can be recognized that the above signalling sequence involves passing a width change signal down a production line in tandem with circuit boards of a given width. Thus, circuit boards of different widths can be processed simultaneously at different points along a production line without the need for a master host computer controlling circuit board progress, individual conveyor track width changes, etc.

The width change signal is transmitted by the controller for an individual processing station preferably in the same format it is received from an upstream station. Significantly, the signal can thereby originate at the adjacent upstream station. It will be recognized by those skilled in the art that processing stations which perform an operation on the circuit board may be interspersed with nonoperating stations, for example, accumulation devices, quality inspection stations, manual operation stations, etc.

Those skilled in the art will realize from the above description of preferred embodiments, that various modification and additions can be made without departing from the true scope of spirit of the novel subject matter disclosed. All such modifications and additions are intended to be within the scope of the following claims.

What is claimed is:

1. A circuit board production line comprising:

a) a series of operatively interconnected circuit board processing stations, each comprising:

operating means for performing an operation on circuit boards;

conveyer means comprising a circuit board conveyor track extending longitudinally from a board receiving end to a board discharging end, and having a lateral width adjustable to accommodate a range of circuit board widths, for receiving a series of said circuit boards, conveying each of the circuit boards in turn from the receiving end to the operating means and then to the discharging end, and then discharging the circuit boards from the discharging end;

conveyor width adjustment means for changing the lateral width of the circuit board conveyor track; and conveyor control means for (i) receiving a board width data signal from an adjacent upstream station, said board width data signal corresponding to a new width for the circuit board conveyor track to accommodate a circuit board to be passed from said adjacent upstream, station, (ii) actuating the conveyor width adjustment means to change the lateral width of the circuit board conveyor track to said new width, and (iii) passing said board width data signal to a conveyor controller of an adjacent downstream station; and b) a data signal communication network directly connecting the control means of each of said circuit board processing stations to the conveyor controller of said adjacent downstream station.

2. The circuit board production line of claim 1 wherein the conveyor control means is a programmable logic controller.

3. The circuit board production line of claim 2 wherein the programmable logic controller actuates the conveyor width adjustment means in response to said board width data signal following receipt of a conveyor-empty signal indicative of the circuit board conveyor track being empty.

4. The circuit board production line of claim 3 wherein the programmable logic controller actuates the conveyor means to pass a circuit board of the new width to the adjacent downstream station in response to receipt of a station-ready signal passed upstream to said programmable logic controller directly from the conveyor controller of said adjacent downstream station, said station-ready signal being indicative of a circuit board conveyor track of said adjacent downstream station having been adjusted to said new width.

5. The circuit board production line of claim 4 wherein the programmable logic controller, following adjustment of the circuit board conveyor track to the new width, sends a station-ready signal upstream directly to a circuit board conveyor controller of the adjacent upstream circuit board processing station.

6. The circuit board production line of claim 1 wherein said series of circuit board processing stations also includes a lead station comprising;

lead station conveyer means comprising a lead station board conveyor track extending longitudinally from a board receiving end to a board discharging end and having a lateral width adjustable to accommodate a range of circuit board widths, for receiving a series of circuit boards, conveying each of the circuit boards in turn form the receiving end to the discharging end, and then discharging the circuit boards from the discharging end to an adjacent downstream station;

lead station conveyor width adjustment means for changing the lateral width of the lead station board conveyor track; and lead station control means for actuating the lead station conveyor width adjustment means to change the lateral width of the lead station board conveyor track to said new width, and for passing said board width data signal to a conveyor controller of an adjacent downstream station, the lead station control means comprising data input means for receiving board width information and generating said board width data signal in response to said board width information.

7. The circuit board production line of claim 6 wherein the lead station control means further comprises visual display means for displaying information indicative of said new width upon input of said board width information to said data input means.

8. The circuit board production line of claim 6 wherein the data input means is manually operable.

9. The circuit board production line of claim 6 wherein the data input means comprises a bar code scanner.

10. The circuit board production line of claim 6 further comprising a circuit board feed station for storing circuit boards and feeding them serially to the board receiving end of the lead station board conveyor track.

11. A peer-to-peer control system for a circuit board production line comprising:

circuit board processing stations each having an adjustable width conveyor track and control means for controlling the width of the conveyor track in response to a board width data signal, the circuit board processing stations being arranged adjacent one another in a series to pass a circuit board from the conveyor track of one to the conveyor track of an adjacent downstream circuit board processing station, and a control system comprising a data signal communication network directly connecting the control means of each of said circuit board processing stations to the control means of upstream and downstream adjacent ones of said circuit board processing stations, for passing signals directly from each of said circuit board processing stations to upstream and downstream adjacent ones of said board processing stations, wherein said board width data signal is passed directly via said data signal communications network from the control means of said one circuit board processing stations to the control means of the adjacent downstream one of said circuit board processing stations and thereafter is passed directly via said data signal communication network from the control means of said adjacent downstream one of said circuit board processing stations to the control means of a next adjacent downstream one of said circuit board processing stations.

12. A method of producing circuit boards on a production line comprising: a series of circuit board processing stations, each comprising:

operating means for performing an operation on circuit boards;

conveyer means comprising a circuit board conveyor track extending longitudinally from a board receiving end to a board discharging end and having a lateral width adjustable to accommodate a range of circuit board widths, for receiving a series of said circuit boards, conveying each of the circuit boards in turn from the receiving end to the operating means and then to the discharging end, and then discharging the circuit boards from the discharging end;

conveyor width adjustment means for changing the lateral width of the circuit board conveyor track;

conveyor control means for (i) receiving a board width data signal from an adjacent upstream station, said board width data signal corresponding to a new width for the circuit board conveyor track to accommodate a circuit board to be passed from said adjacent upstream station, (ii) actuating the conveyor width adjustment means to change the lateral width of the circuit board conveyor track to said new width, and (iii) passing said board width data signal to a conveyor controller of an adjacent downstream station;

b) a lead station comprising:

a lead station board conveyor track extending longitudinally from a board receiving end to a board discharging end and having a lateral width adjustable to accommodate a range of circuit board widths, for receiving a series of circuit boards, conveying each of the circuit boards in turn from the receiving end to the discharging end, and then discharging the circuit boards from the discharging end to an adjacent downstream station;

lead station conveyor width adjustment means for changing the lateral width of the lead station conveyor track; and lead station control means for actuating the lead station conveyor width adjustment means to change the lateral width of the lead station board conveyor track to said new width, and for passing said board width data signal to a conveyor controller of an adjacent downstream station, the lead station control means comprising data input means for receiving board width information and generating said board width data signal in response to said board width information; and c) a data signal communication network directly connecting the control means of each of said circuit board processing stations to the conveyor controller of said adjacent downstream circuit station;

said method comprising the steps of:

1) board width information being entered to the data input means of the lead station control means corresponding to said new width;

2) the lateral width of the lead station conveyor track, when the lead station conveyor track is empty, then being adjusted to said new width and a circuit board of said new width then being fed to the receiving end of the lead station conveyor track;

3) the lead station control means then sending said board width data signal directly via the data signal communication network to the conveyor control means of an adjacent downstream circuit board processing station;

4) the control means of the adjacent downstream circuit board processing station, if the lateral width of its circuit board conveyor track is not equal to the new width, then (i) signaling to the lead station control means to prevent circuit boards being passed from the lead station, (ii) waiting until its circuit boards conveyor track is empty of circuit boards, (vii) actuating its conveyor width adjustment means to change the lateral width of its board conveyor track to that new width, and (iv) signalling to the lead station control means to pass circuit boards;

5) the conveyor control means of the adjacent downstream circuit board processing station after step 4(i) sending said board width data signal directly via the data signal communication network to the conveyor control means of a next adjacent downstream circuit board processing station, (ii) signalling that a circuit board is available to be passed to the board conveyor track of the next adjacent downstream circuit board processing station, and (iii) thereafter actuating the circuit board conveyor track of the downstream adjacent circuit board processing station to pass a circuit board to the conveyor track of the next adjacent downstream circuit board processing station in response to the conveyor control means of the next adjacent downstream circuit board processing station signaling to pass circuit boards; and 6) the control means of said next adjacent downstream circuit board processing station then performing, with another circuit board processing station which is downstream adjacent to it, steps corresponding to steps (3) through (5).

13. The circuit board production line in accordance with claim 12, wherein said board width information is entered manually in step 1.

14. The circuit board production line in accordance with claim 12 wherein said board width information is entered via a bar code reader which reads a bar code on a circuit board to be fed to the lead station conveyor track.

* * * * *